United States Patent
Elazar

[15] 3,699,469

[45] Oct. 17, 1972

[54] DIFFERENTIAL AMPLIFIER

[72] Inventor: Shmuel Elazar, Ventura County, Calif.

[73] Assignee: Statham Instrument, Inc., Oxnard, Calif.

[22] Filed: Jan. 2, 1970

[21] Appl. No.: 100

[52] U.S. Cl. ......................330/30 D, 330/22, 330/69
[51] Int. Cl. ..............................................H03f 3/68
[58] Field of Search .........330/22, 30 R, 30 D, 40, 69

[56] References Cited

UNITED STATES PATENTS

| | | | |
|---|---|---|---|
| 3,487,324 | 12/1969 | Jones | 330/30 |
| 3,046,487 | 7/1962 | Matzen et al. | 330/30 X |
| 3,262,066 | 7/1966 | Trilling | 330/30 D |
| 3,419,809 | 12/1968 | Lach et al. | 330/69 X |
| 3,451,001 | 6/1969 | Foerster | 330/30 D |

*Primary Examiner*—Roy Lake
*Assistant Examiner*—Lawrence J. Dahl
*Attorney*—Philip Subkow, George J. Netter and Kendrick and Subkow

[57] ABSTRACT

The differential amplifier circuit employs a pair of amplifier legs of similar electrical characteristics. Input signals are applied across the two legs at the base of a pair of transistors forming a first amplification stage. A further pair of output transistors are interrelated with the input amplification stage, and interconnecting the output transistors are constant current devices. Biasing voltage is applied via the constant current devices whereby common-mode signals are denied a path to the amplifier input and are effectively cancelled out to provide an output for the differential amplifier that is substantially purely related to the information signal. Another aspect is the provision of an input isolation circuit for eliminating common-mode return paths where the differential amplifier has internal voltage bias.

5 Claims, 2 Drawing Figures

PATENTED OCT 17 1972

3,699,469

INVENTOR
SHMUEL ELAZAR
BY KENDRICK and SUBKOW
George J. Netter
ATTORNEYS

DIFFERENTIAL AMPLIFIER

BACKGROUND OF THE INVENTION

The present invention relates generally to differential amplifiers, and, more particularly, to a differential amplifier circuit for accommodating unbalanced signal sources.

A differential amplifier is a circuit that provides an output signal which is the amplified difference of two input signals. By means of a differential amplifier, so-called common-mode signals which are present in both of the input signals can be eliminated. The undesirable common-mode noise signals are frequently found superimposed in the input line with the information signal, whereas on the other line they may exist in an inverted form. Accordingly, when the two signal lines are applied to the input of a differential amplifier, the amplifier output in subtracting the spurious signals from one another provides the information signal substantially unimpaired or unaffected by the common-mode noise.

This capability of a differential amplifier to cancel common-mode signals is frequently referred to as common-mode rejection. Many known differential amplifiers, such as that described in the U.S. Pat. No. 3,042,876 to J. B. Pegram have a high common-mode rejection when the source providing the signal inputs is balanced, which is the case, for example, in many bridge transducer applications. There are many other situations, however, in which the source from which the signals are obtained are unbalanced. In this case, common-mode signals will be of different magnitude at the input to the differential amplifier, which spurious difference will, in turn, be amplified through the amplifier, providing an output signal which contains a significant common-mode component.

In explanation, current will flow through each of the input lines through known differential amplifiers and return through a common impedance in the case of either a balanced or an unbalanced source. However, where there is an unbalanced source, a larger voltage drop will occur in one of the input lines, causing an inequality in the common-mode signals presented to the differential amplifier, and, thus, generating a corresponding error in the differential amplifier output.

OBJECTS AND SUMMARY OF THE INVENTION

It is, therefore, a primary aim and object of the present invention to provide a differential amplifier which can handle common-mode signals from an unbalanced source and provide output substantially free of common-mode error.

Another object of the invention is to provide a differential amplifier which eliminates undesirable common-mode current paths back to the amplifier input.

A still further object of the invention is the provision of a differential amplifier having low operating currents while being capable of delivering a relatively high output current.

The differential amplifier circuit of the present invention employs a pair of amplifier legs of similar electrical characteristics. Input signals are applied across the two legs at the base of a pair of transistors forming a first amplification stage. A further pair of output transistors are interrelated with the input amplification stage, and interconnecting the output transistors are constant current devices. Biasing voltage is applied via the constant current devices whereby common-mode signals are denied a path to the amplifier input and are effectively cancelled out to provide an output for the differential amplifier that is substantially purely related to the information signal.

Another aspect of the present invention is the provision of an input isolation circuit for eliminating common-mode return paths where the differential amplifier has internal voltage bias.

DESCRIPTION OF A PREFERRED EMBODIMENT

Figure 1:
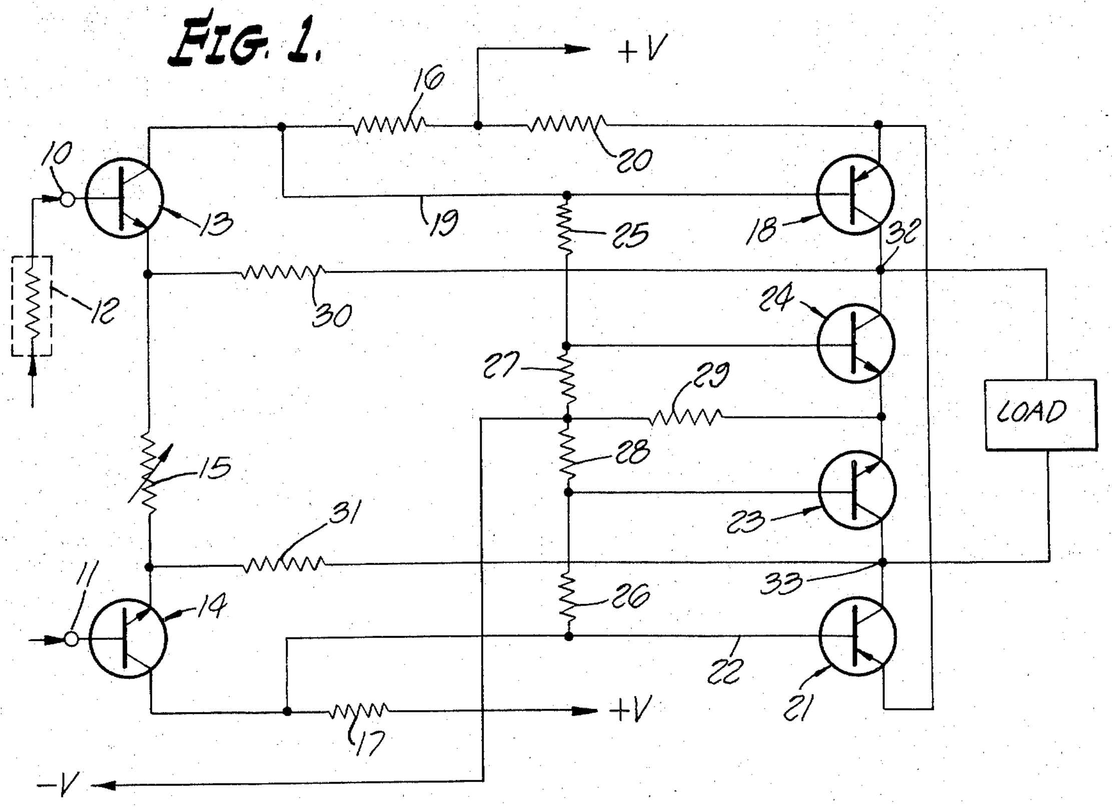
FIG. 1 is a schematic wiring diagram of the differential amplifier of the present invention.

FIG. 1 of the drawing depicts the circuit schematic of the differential amplifier of this invention, including a pair of input terminals 10 and 11 for accommodating a corresponding pair of input signals, the difference of which is to be amplified. Although this differential amplifier will work equally well with a balanced signal source, operation will be primarily described with an unbalanced source exemplified by the stylized representation of a resistance 12 in the circuit to terminal 10.

Terminal 10 is connected to the base of an NPN transistor 13 and terminal 11 connects with the base of a further NPN transistor 14, which transistors form the initial or first amplification stage of the amplifier. The transistor emitters are related via a variable resistance 15, the setting of which determines overall gain of the amplifier. The collectors of transistors 13 and 14 are positively biased, respectively, through resistances 16 and 17 by positive voltage source, V+.

Transistor 13 collector connects with the base of a PNP transistor 18 via lead 19, the emitter of which is positively biased from the source V+ through resistance 20. Similarly, the base of a further PNP transistor 21 interconnects with the collector of transistor 14 by lead 22 while its emitter is commoned with the emitter of 18 for positive bias. The transistors 18 and 21 provide a second stage of amplification which also serves as the differential amplifier output.

NPN transistors 23 and 24 have their emitter-collector electrodes serially interrelating the collectors of transistors 18 and 21. In detailed connection, the collector of 24 is connected to the collector of 18, the emitter of 23 and 24 are commoned, and the collector of 23 is connected to the collector of 21. As will be more fully described below, the transistors 23 and 24 are so biased to operate as constant current devices. Positive bias for the base of transistor 24 is provided from lead 19 through a resistance 25, while similarly positive bias is provided through a resistance 26 and interconnecting lead 22 to the base of transistor 23. Resistances 27 and 28 serially interconnect the bases of transistors 23 and 24, the common point of which resistances is connected to the −V terminal of the voltage source. The emitters of transistors 23 and 24 are voltage referenced via resistance 29. Balance resistances 30 and 31 interconnect the emitter of transistor 13 with the collector of 18 and the emitter of transistor 14 with the collector of 21, respectively. Output for the differential amplifier circuit, also identified as LOAD, is taken across the collector electrodes of 18 and 21.

It is clear that positive going voltage signals applied to the base of transistor 13 provides for a flow of current through the transistor collector-emitter path, resistor 30, the collector-emitter path of transistor 24, resistor 29 and to −V. A similar current path exist for transistor 14 through resistance 31, collector-emitter path of 23, and resistance 29 to −V. Accordingly, the output terminals 32 and 33 will each have a potential directly related to the input voltage of the respective transistors 13 and 14. Transistors 18 and 21 also serve to further amplify or modify the potential of the output terminals 32 and 33. It is manifest, therefore, that the potential difference between output terminals 32 and 33, i.e., across the LOAD, will follow the instantaneous potential difference of the signals impressed on input terminals 10 and 11, thereby providing the desired differential amplifier function.

It is readily apparent that common mode signals from a balanced source will be seen simply as a pair of equal value potentials at 10 and 11, which, through subtractive action of the amplifier, do not produce a component across the LOAD.

When common mode signals arise from an unbalanced source, there is no common mode current path through the amplifier that would cause a drop across unbalance resistance 12 and thus be reflected as a common mode error at the LOAD. Lacking a current path for the common mode signal, the end result achieved is same for balanced or unbalanced sources — the common mode signals do not affect amplifier output.

It is instructive to compare amplifier operation for common mode signals and differential or information signals in regard to relative currents through transistors 18 and 24. It has already been shown that for common mode signals, the current through transistor 24 (and transistor 23 as well) is maintained constant. However, when a differential signal is applied across 10 and 11 and, say, the collector voltage of 13 increases, the collector of 14 will decrease. The collector voltage increase for 13 will cause transistor 24 to conduct more current and transistor 18 less. The reverse situation obtains with transistors 21 and 23. Accordingly, the present amplifier experiences constant current through transistors 23 and 24, in the case of common-mode signal input, and variable current for differential voltage input signals.

When a positive going common-mode signal is applied to the bases of both transistors 13 and 14, the collectors of these same transistors will attempt to reach a lower potential which will produce a reduction in the current passing through the transistors 23 and 24 from transistors 13 and 14, while at the same time current supplied by the transistors 18 and 21 will increase current flow through 23 and 24. This action of the transistors at the output end is reflected back via resistances 30 and 31, reducing the current flow through transistors 13 and 14, thereby raising their collector electrode potentials to the initial value. The practical advantageous result of this action is that the amplifier can handle relatively high common-mode voltages without experiencing correspondingly high circuit operating voltages.

There are many situations in which the D. C. bias source for the differential amplifier cannot be the same as is used for the information signal source. For example, in the use of a blood flow meter, it is impractical to use the same bias source for the blood probe and the differential since the two sets of equipment are usually located at a relatively considerable distance. When internal bias is provided for the amplifier in such cases there is an accompanying undesirable current path to the common voltage.

Figure 2:
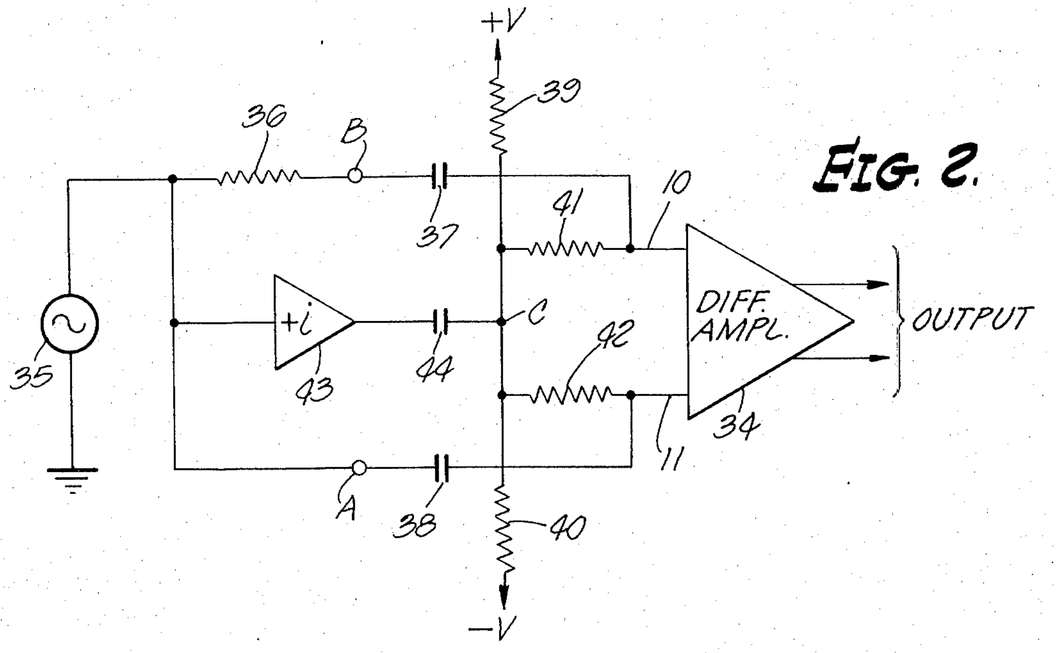
FIG. 2 is a modified form of the invention in which the amplifier circuit has internal bias.

Reference is now made to FIG. 2 and a schematic representation of a preferred circuit for eliminating common-mode current paths when internal bias is used with the circuit of FIG. 1. The differential amplifier 34 (DIFF. AMPL.) is identical in construction to that already described and shown in FIG. 1 other than the D. C. bias is not shared with the information signal source which is available at points A and B. The common-mode voltage is depicted as an alternating voltage generator 35 connected to terminals A and B with the B leg including an unbalancing resistive impedance 36. Terminal B connects with amplifier input terminal 10 through a D. C. blocking capacitor 37 and terminal A connects with 11 through blocking capacitor 38. D. C. bias is provided terminals 10 and 11 through scaling resistors 39 and 40 serially arranged across +V and −V, and resistors 41 and 42, respectively. An amplifier 43 (+*i*) having a gain of one and a high input impedance interconnects the common-mode voltage source 35 through a blocking capacitor 44 with the common point of resistors 41 and 42, also identified as C. The amplifier 43 in transferring the common signal to point C brings the points A, B and C to the same potential and, accordingly, no common-mode current will flow through resistors 41 and 42.

What is claimed is:

1. A differential amplifier comprising:

an input amplifying stage having a pair of separate current paths therethrough for passing separate signal inputs;

a succeeding amplifying stage having a pair of current paths for receiving the respective amplified current signals from said first amplifying stage;

first and second transistors having their collector-emitter circuits connected to the respective outputs of said succeeding stage and an interconnection between the transistors and a bias voltage source; and a high resistance common-mode connection to the collector-emitter circuits of said second transistors from the input amplifying stage such that common-mode signals are deprived of a significant current path to said bias voltage source.

2. A differential amplifier circuit, comprising:

first and second three element transistors having their collector-emitter circuits connected to one another and oppositely poled, the bases of each transistor being connected to receive separate input signals;

third and fourth transistors connected to receive at their respective bases the amplified signals from said first and second transistors and having a pair of output terminals;

fifth and sixth transistors serially interconnecting the collector-emitter circuits of said third and fourth transistors, said fifth and sixth transistors having their emitter-collector circuits oppositely poled, a voltage bias source, one pole thereof connected to the collector-emitter circuit of said transistors and the common point between the emitter-collector circuits of said fifth and sixth transistors being connected to the other pole of said bias voltage source; and a pair of high impedance interconnection means separately connected between the output terminals and the same element of each of the first and second transistors whereby common-mode signals presented to the bases of said first and second transistors do not generate significant currents through said differential amplifier circuit.

3. A differential amplifier, a pair of input amplifying stages having a pair of separate current paths for receiving and amplifying respectively a pair of differential signals, a second amplifying stage having a pair of amplifying stages, the outputs of the first amplifying stages being connected separately to the respective inputs of the second stages, a pair of relatively high resistance common-mode connections between the respective outputs of said input stages and said second stage outputs, a voltage bias source for said amplifier, said common-mode connections constituting the sole common-mode current path through the amplifier resulting in relatively small common-mode currents therethrough irrespective of common-mode voltage signal magnitudes.

4. A differential amplifier, a pair of amplifying transistors, one electrode of each of said transistors interconnected to separate signal inputs, a voltage bias source, one pole of said voltage bias source being connected to an electrode of each of said transistors, a succeeding pair of transistors complementary to the first-mentioned transistors, an output electrode of the first-mentioned transistors being connected to an input electrode of the said second-mentioned transistors, a further electrode of said second-mentioned transistors being connected to the first-mentioned pole of said voltage bias source, another of said electrodes of each of said second-mentioned transistors providing the output of the amplifier, and to the collector-emitter circuits of a third pair of transistors, the bases of said last-named transistors interconnected with the bases of said second-mentioned pair of transistors, and a common point between the third-mentioned set of transistors connected to the other pole of said voltage bias source, and a high resistance connection between said amplifier output and the output electrodes of said first-mentioned pair of transistors for establishing a relatively low current path to all common-mode signals present at the input electrodes of said amplifying transistors irrespective of common mode voltage signal amplitude.

5. A differential amplifier, comprising:

a pair of input transistor amplifying stages having a pair of separate current paths therethrough for passing and amplifying separate signal inputs;

a succeeding amplifying stage containing a pair of transistors having a pair of current paths for receiving the respective amplifier current from said first mentioned amplifying stage;

feedback connection from the succeeding transistors of the succeeding amplifying stage to each of the preceding amplifying transistors in each of said current paths;

a common-mode connection to the emitters of each of the transistors in the succeeding amplifying stage;

means for maintaining a constant current in said common-mode connection, said means including the collector-emitter circuits of a pair of transistors, one each of said transistors in series with the collector-emitter circuit of one of each of said succeeding pair of transistors;

an interconnection between the third mentioned pair of transistors and a bias voltage source;

the collector emitter circuit of said third mentioned transistors forming a high resistance common mode connection to the collector-emitter circuit of said succeeding pair of transistors, whereby common-mode signals are deprived of a significant current path to said bias voltage source.

* * * * *